United States Patent [19]

Nishioka et al.

[11] Patent Number: 4,853,341

[45] Date of Patent: Aug. 1, 1989

[54] PROCESS FOR FORMING ELECTRODES FOR SEMICONDUCTOR DEVICES USING FOCUSED ION BEAMS

[75] Inventors: Tadashi Nishioka; Yoji Mashiko; Hiroaki Morimoto; Hiroshi Koyama, all of Itami, Japan

[73] Assignee: Mitsubishi Denki Kabushiki Kaisha, Japan

[21] Appl. No.: 118,031

[22] Filed: Nov. 9, 1987

[30] Foreign Application Priority Data

Mar. 25, 1987 [JP] Japan .................................. 62-72211
Jul. 15, 1987 [JP] Japan ................................. 62-174909

[51] Int. Cl.⁴ .................. H01L 21/265; H01L 21/20; H01L 21/44
[52] U.S. Cl. ............................ 437/24; 148/DIG. 50; 148/DIG. 131; 148/DIG. 158; 148/DIG. 20; 156/644; 156/656; 357/65; 427/38; 437/90; 437/192; 437/195; 437/203; 437/245; 437/935; 437/915
[58] Field of Search ............... 148/DIG. 51, 158, 131, 148/46, 50, 20; 427/38; 437/18, 51, 89, 24, 90, 189, 192, 195, 203, 245, 246, 735, 930, 915; 357/65, 71; 156/643, 644, 656, 664

[56] References Cited

U.S. PATENT DOCUMENTS

| | | | |
|---|---|---|---|
| 3,769,108 | 10/1973 | Feldman et al. | 437/246 |
| 4,184,909 | 1/1980 | Chang | 437/190 |
| 4,355,456 | 10/1982 | Harnagel et al. | 437/190 |
| 4,361,599 | 11/1982 | Wourms | 437/190 |
| 4,481,283 | 11/1984 | Kerr et al. | 437/195 |
| 4,523,372 | 6/1985 | Balda et al. | 156/646 |
| 4,525,922 | 7/1985 | Kiriseko | 437/176 |
| 4,619,840 | 10/1986 | Goldman et al. | 437/200 |
| 4,653,428 | 3/1987 | Wilson et al. | 118/725 |
| 4,685,030 | 8/1987 | Reyes et al. | 427/96 |
| 4,707,717 | 11/1987 | Hirabayashi et al. | 357/23.11 |

FOREIGN PATENT DOCUMENTS 0161285 12/1979 Japan .................................. 437/190

OTHER PUBLICATIONS

Sze, *VLSI Technology*, McGraw-Hill Book Co., NY, 1983, pp. 336–340.

Primary Examiner—Brian E. Hearn
Assistant Examiner—William Bunch
Attorney, Agent, or Firm—Leydig, Voit & Mayer

[57] ABSTRACT

A process for forming electrodes for semiconductor devices having a semiconductor substrate and an electrically conductive portion covered and protected by an electrically insulating coating. The process including the steps of forming an electrically conductive film on the electrically insulating coating, forming an electrode to be connected to an external circuit on the electrically conductive film at a position overlying the electrically conductive portion by exposing portions of the electrically insulating coating and the first electrically conductive film to a converged ion beam, electrically connecting the electrode to the exposed portions of the electrically conductive film, and removing the portions of the electrically conductive film not covered by the electrode. As a result, the likelihood of breakdown of the internal circuit of the semiconductor device connected to the electrically conductive portion while the electrode is being formed in greatly reduced.

18 Claims, 16 Drawing Sheets

FIG. IA
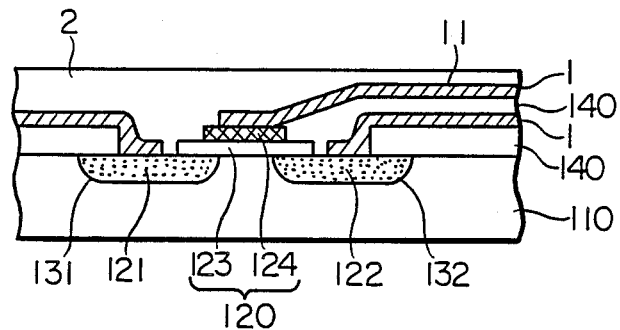
FIG. IB
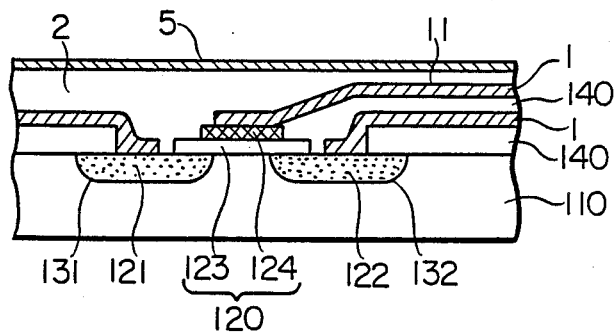
FIG. IC
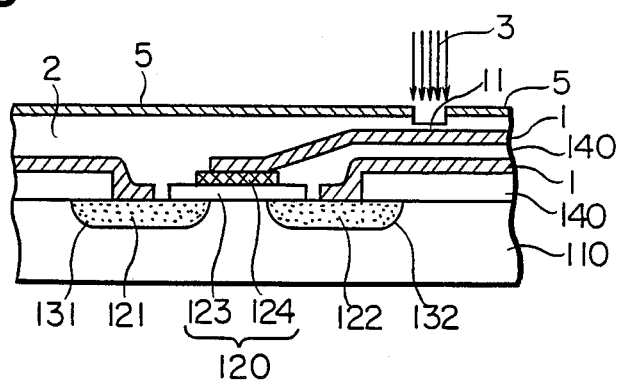

PROCESS FOR FORMING ELECTRODES FOR SEMICONDUCTOR DEVICES USING FOCUSED ION BEAMS

BACKGROUND OF THE INVENTION

1. Field of the Invention

The present invention relates to a process for forming electrodes for semiconductor devices, and more particularly to a process for forming an electrode for providing an electrical connection between an external circuit and an electrically conductive portion of the semiconductor device such as a metal wiring layer protectively covered by an electrically insulating coating.

2. Description of the Prior Art

When a semiconductor device having its surface covered by an electrically insulating coating is subjected to failure analysis, an analyzing electrode electrically connected to the internal circuit of the semiconductor device must frequently be newly formed on the electrically insulating protective coating. A semiconductor device to be analyzed may not have been provided with external lead terminals or bonding pads, or even if the semiconductor device has external lead terminals or bonding pads, it may be difficult to obtain a satisfactory failure analysis merely by utilizing the incoming/outgoing signals passing through the external lead terminals or the bonding pads. In these cases, if electrical signals are to be transmitted to and received from the internal circuit of the semiconductor device, it becomes particularly necessary to form such an analyzing electrode.

When an electrically conductive portion such as metal wiring constituting a part of the semiconductor device has a large pattern size or the interval between two adjacent patterns is large, the metal wiring may be exposed by partially or completely removing the electrically insulating protective coating of the semiconductor device. Subsequently, if a probe is directly brought into contact with the thus-exposed metal wiring, electrical signals can be transmitted to and received from the internal circuit of the semiconductor device for analyzing purposes.

Recently, however, as semiconductor devices have become increasingly integrated and more complicated, the pattern size of their metal wiring and the interval between adjacent patterns have been reduced to a significant extent. Therefore, such a size or interval is far smaller than the tip diameter of the probe, and this may cause various difficulties; for example, the tip of the probe may cause damage to the metal wiring during failure analysis. This makes it difficult to subject semiconductor devices to failure analysis. To cope with this problem, the following prior-art process has been utilized. In the conventional process which will be described later, an analyzing electrode having a size larger than the tip diameter of the probe is formed on the electrically insulating protective coating of a semiconductor device, with the analyzing electrode electrically connected to the internal circuit of the device. In order to transmit and receive electrical signals to and from the internal circuit of the device, a probe is brought into contact with the thus-formed analyzing electrode.

FIGS. 5A to 5E are respectively diagrammatic, cross sections used for explaining a process sequence for forming an electrode for a semiconductor device according to the prior art. The prior-art process for forming an electrode will be described below with reference to FIGS. 5A to 5E.

Referring first to FIG. 5A, a semiconductor substrate of one conductivity type is indicated at 110, and includes a source (or drain) 121 and a drain (or source) 122 both of which are formed as impurity-diffused regions. P-n junctions 131 and 132 are respectively formed at the boundary between the source (or drain) 121 and the substrate 110 as well as that between the drain (or source) 122 and the substrate 110. The substrate 110 partially serves as a channel region for providing an electrical connection between the source (or drain) 121 and the drain (or source) 122. A gate oxide film 123 is formed on the portion of the substrate 110 that forms such a channel region, and a gate electrode 124 is further formed on the film 123, thereby constituting a MOS transistor 120. Metal wires 1 each serving as an electrically conductive portion are respectively connected to the gate electrode 124, the source (or drain) 121 and the drain (or source) 122. An isolation film 140 electrically isolates the metal wires 1 from the substrate 110 as well as the metal wires 1 from one another. The entire surface of the semiconductor device having the aforesaid arrangement is covered by an electrically insulating protective coating 2 serving as an isolation layer so that the device surface may be smoothed and at the same time the semiconductor device may be protected from contamination.

As shown in FIG. 5A, in order to dispose an analyzing electrode on the thus-formed semiconductor device, a converged ion beam 3 is locally irradiated onto the portion of the electrically insulating protective coating 2 overlying a connecting portion 11 of the metal wire 1 to which the analyzing electrode is to be connected.

Referring to FIG. 5B, the constituent atoms of the thus-irradiated portion of the electrically insulating protective coating 2 are scattered by the phenomenon of sputtering through irradiation of the converged ion beam 3, and to thus bore into the irradiated portion.

As shown in FIG. 5C, this boring is continued until the desired portion of the metal wire 1 is exposed, that is, to a depth required for electrical connection. Thus, a predetermined opening is formed in the electrically insulating protective coating 2.

Referring to FIG. 5D, while a gaseous or vaporized metal compound 31, which can be decomposed to generate a metal through irradiation of a converged ion beam, is being supplied to an area which includes a portion to be bored, i.e., the connecting portion 11 and which corresponds to the shape and size of an analyzing electrode to be formed, this area is also being irradiated with the converged ion beam 3 to cause decomposition of the metal compound 31, thereby forming a film 6.

After the film 6 having a predetermined shape, size and thickness has been formed, the irradiation of the converged ion beam 3 and the supply of the metal compound 31 are stopped. As shown in FIG. 5E, the metal film 6 obtained in this final step serves as an analyzing electrode 4.

However, the aforesaid prior-art process for forming an analyzing electrode involves the following disadvantages which will be described below with reference to FIGS. 6A to 6C.

FIG. 6A is a diagrammatic, cross section used for explaining the disadvantages of the prior-art process for forming an analyzing electrode for a semiconductor device.

Referring to FIG. 6A, Cm represents the electrical capacitance which is produced between the substrate 110 and the metal wire 1 to which the analyzing electrode 4 is to be connected, that is before the electrode 4 has been formed. Ce represents the electrical capacitance which is produced between the substrate 110 and the analyzing electrode 4 including the metal wire 1 to which the electrode 4 is finally connected, that is after the electrode 4 has been formed on the metal wire 1. Ib represents the ion current of the converged ion beam 3. Te represents the ion irradiation period which is required to form the analyzing electrode 4 on the protective coating 2 by irradiating the metal film 6 with the converged ion beam 3 while the metal compound 31 is being supplied. Ve represents the potential difference between the substrate 110 and the analyzing electrode 4 including the metal wire 1. Vt represents the critical potential difference Ve which causes breakdown of the semiconductor device, that is, the value of withstand voltage. Also, secondary electrons generated through irradiation of the converged ion beam 3 are indicated by 32.

After the electrically insulating protective coating 2 has been bored until the desired portion of the metal wire 1 is exposed, the metal compound 31 is decomposed through irradiation of the converged ion beam 3. The analyzing electrode 4 is formed by growing the thus-generated metal film 6 in an area which corresponds to the predetermined shape and size of the analyzing electrode 4 and which includes the bored portion, i.e., the connecting portion 11. In the meantime, the ion current Ib of the converged ion beam 3 is incident upon the metal wire 1. The flow of the ion current Ib upon the metal wire 1 continues until the metal film 6 reaches a predetermined shape, size and thickness to form the analyzing electrode 4. Accordingly, after the ion irradiation period Te has elapsed, that is, when the formation of the analyzing electrode 4 is complete, the quantity of electric charge Qe supplied to the metal wire 1 becomes $Qe = Ib \cdot Te$, and the potential difference Ve between the metal wire 1 and the substrate 110 becomes $Ve = Qe/Ce$. Therefore, even if the ion current Ib, the ion irradiation period Te of the converged ion beam 3 and the quantity of electric charge Qe are respectively the same, as the electrical capacitance Ce becomes smaller, the potential difference Ve becomes larger.

However, in highly integrated semiconductor devices, the electrical capacitance Cm is relatively small because of the extremely reduced pattern sizes of, for example, the MOS transistor 120, the source (or drain) 121, the drain (or source) 122, the gate electrode 124, the metal wires 1 and other constituent elements. Also, since the gate oxide film 123 is extremely reduced in thickness, the withstand voltage Vt of the gate oxide film 123 is of a low level. Since the interval between the substrate 110 and the analyzing electrode 4 is greater than the thickness of the gate oxide film 123, the electrical capacitance between the substrate 110 and the electrode 4 is relatively small and the electrical capacitance Ce including the aforesaid capacitance Cm is also relatively small. In the case of such small electrical capacitance Ce, if the quantity of electric charge Qe based on ordinary levels of Ib and Te is supplied to the metal wire 1, the potential difference Ve readily exceeds the level of the withstand voltage Vt. This may result in the breakdown of the semiconductor device.

As an example, if the analyzing electrode 4 having a size which allows the tip of an ordinary type of probe to be brought into contact with the electrode 4, for example, a square form with each side 80 to 120 μm long, is to be formed in accordance with the aforesaid process, almost all semiconductor devices will be broken before an analyzing electrode with such a size can be formed.

In such cases, in order to prevent the occurrence of breakdown in the semiconductor devices, the size of the analyzing electrode 4 may be enlarged to increase the value of Ce. However, if the size is enlarged, the ion irradiation period Te is extended to increase the values of Qe and Ve, thereby causing the level of Ve to exceed that of Vt. This may also result in the breakdown of the semiconductor device.

In particular, since the converged ion beam 3 is commonly a beam of positive ions, a secondary ion current Ise of the secondary electrons 32 produced through irradiation of the converged ion beam 3 flows in the same direction as that of the ion current Ib. Therefore, the potential difference Ve becomes $Ve = (Ib + Ise) \cdot Te/Ce$, and exceeds the previously-mentioned level of Ve. In consequence, it becomes even easier for the semiconductor device to breakdown.

More specifically, referring to another example shown in FIG. 6B, while the converged ion beam 3 is being irradiated until the metal film 6 having a predetermined shape, size and thickness is obtained, the potential at the gate electrode 124 which is electrically connected to the metal wire 1 and the metal film 6 exceeds the level of withstand voltage of the gate oxide film 124 to cause dielectric breakdown of the gate oxide film 124. This results in the failure of the MOS transistor 120.

Referring to the other example shown in FIG. 6C, the potential at the source (or drain) 121 electrically connected to the metal wire 1 exceeds the level of withstand voltage of the p-n junction to cause breakdown of the p-n junction 131, and thus results in the failure of the MOS transistor 120.

As described above, use of the prior-art process for forming an electrode easily causes breakdown of a semiconductor device to be analyzed, and this may lead to the problem that correct failure analysis can not be performed.

SUMMARY OF THE INVENTION

It is therefore an object of the present invention to provide a process for forming an electrode for a semiconductor device in which it is possible to positively form an electrode over a desired area on the semiconductor device without involving the risk of causing breakdown of the device.

In accordance with the present invention, an electrically conductive film or layer is formed over an electrically insulating film overlying the surface of a semiconductor substrate prior to the formation of an electrode which is to be connected to an external circuit and, following the formation of the electrode, the portion of the electrically conductive film or layer which is not covered by the electrode is removed. Therefore, since the electrical capacitance of the thus-formed electrode increases positively, the degree of increase in the potential difference between the electrically conductive portion and the semiconductor substrate is reduced with respect to the level of the withstand voltage of the semiconductor device. This greatly reduces the likelihood that the internal circuit of the semiconductor device connected to the electrically conductive portion will be broken. Accordingly, the present invention enables exact failure analysis of semiconductor devices.

Further objects, features and advantages of the present invention will become apparent from the following description of preferred embodiments of the present invention with reference to the accompanying drawings.

BRIEF DESCRIPTION OF THE DRAWINGS

FIGS. 1A to 1G are diagrammatic, cross sections used for explaining a process sequence which is carried out by a process constituting a first preferred embodiment of the present invention;

DESCRIPTION OF THE PREFERRED EMBODIMENTS

Figure 1D:
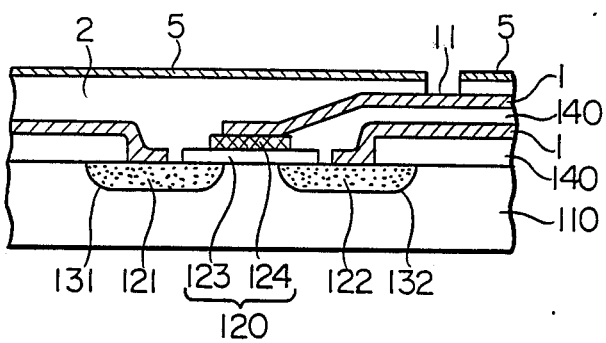

A process for forming an electrode for a semiconductor device in accordance with the present invention will be described below with reference to the accompanying drawings in which like reference numerals are used to denote like or corresponding elements relative to those in preferred embodiments which will be mentioned later.

FIGS. 1A to 1G show each step of the process sequence constituting a first preferred embodiment of the invention.

Referring to FIG. 1A, the semiconductor device has the same arrangement as that of the semiconductor device previously mentioned in the description of the prior-art. More specifically, the semiconductor device includes a semiconductor substrate 110, a source (or drain) 121 and a drain (or source) 122 both of which are formed as impurity-diffused regions. The p-n junctions 131 and 132 are respectively formed at the boundary between the source (or drain) 121 and the substrate 110 as well as that between the drain (or source) 122 and the substrate 110. The substrate 110 partially serves as a channel region for providing electrical connection between the source (or drain) 121 and the drain (or source) 122. The gate oxide film 123 is formed on the portion of the substrate 110 that forms such a channel region, and the gate electrode 124 is further formed on the film 123, thereby constituting the MOS transistor 120. The metal wires 1 each serving as an electrically conductive portion are respectively connected to the gate electrode 124, the source (or drain) 121 and the drain (or source) 122. The isolation film 140 electrically isolates the metal wires 1 from the substrate 110 as well as the metal wires 1 from one another. The entire surface of the semiconductor device having the aforesaid arrangement is covered by the electrically insulating protective coating 2 so that the device surface may be smoothed and at the same time the semiconductor device may be protected from contamination.

As shown in FIG. 1B, a first electrically conductive first metal film 5 is deposited on the electrically insulating protective coating 2 overlying the semiconductor device. This coating is effected over a wide area including the portion of the coating 2 overlying the connecting portion 11 of the metal wire 1 which is to be electrically connected to the analyzing electrode 4 for external connection. It is preferred that the first metal film 5 be deposited without causing electrical breakdown of the semiconductor device in this coating step. Therefore, for example, a 10-nm-thick gold (Au) film may preferably be deposited over the electrically insulating protective coating 2 of the semiconductor device by using known vapor deposition or sputtering methods that involve no electrical charging or low level of electrical charging.

Subsequently, as shown in FIG. 1C, the converged ion beam 3 is irradiated onto a desired portion of the first metal film 5 overlying the protective coating 2 at a desired position in correspondence with the connecting portion 11 to which the analyzing electrode 4 is to be connected. The constituent atoms of the thus-irradiated portions of the first metal film 5 and the protective coating 2 are scattered by sputtering to thus bore into the first metal film 5 and the protective coating 2. The converged ion beam 3 may, for example, be a gallium ion (Ga+) beam having 30-KeV ion beam energy with an ion beam current of 400 to 100 pA. Use of such a converged ion beam 3 enables boring of the electrically insulating protective coating 2 which is made, for example, of a silicon oxide ($SiO_2$) film, a silicon nitride ($Si_3N_4$) film, a film of phosphosilicate glass (PSG) or multi-layers thereof. This boring is continued until the portion of the metal wire 1 corresponding to the connecting portion 11 is exposed, that is, until a depth required for electrical connection is reached. Subsequently, the irradiation of the converged ion beam 3 is stopped, and the boring of the electrically insulating protective coating 2 is completed. The state of the thus-bored protective coating 2 is illustrated in FIG. 1D.

Figure 1E:
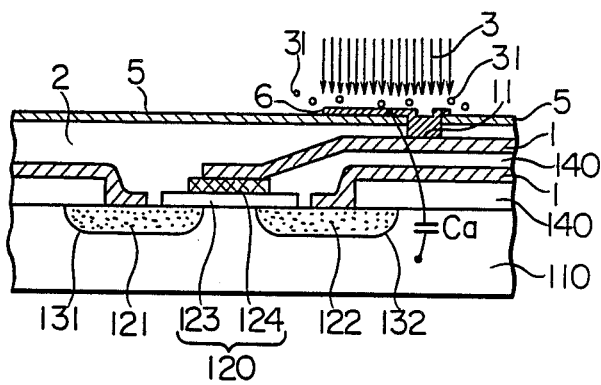

Referring to FIG. 1E, while a gaseous or vaporized metal compound 31, which can be decomposed to generate metal through irradiation of an ion beam, is being supplied to an area which includes the bored portion or the connecting portion 11 and which corresponds to the shape and size of the analyzing electrode 4 to be formed, this area is also being irradiated with the converged ion beam 3 to cause decomposition of the metal compound 31, thereby forming a second metal film 6 which provides an analyzing electrode 4 to be connected to an external circuit.

Figure 1F:
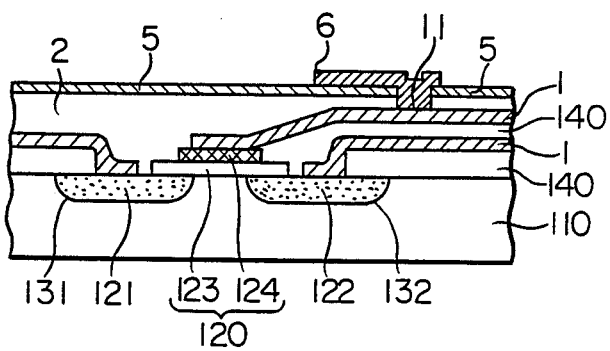

After the metal film 6 having a predetermined shape, size and thickness has been formed, the irradiation of the converged ion beam 3 and the supply of the metal compound 31 are stopped. The metal compound 31 is made of, for example, tungsten carbonyl ($W(CO_3)_6$) If such a metal compound 31 made of tungsten carbonate is combined with the converged ion beam 3 including gallium ions (Ga+) having 30-KeV ion beam energy with an ion beam current of 400 to 100 pA, a 100-nm-thick film of tungsten (W) can be formed as the analyzing electrode 4. In this case, if the metal compound 31 is made of molybdenum carbonyl ($Mo(Co_3)_6$), a film of molybdenum is produced as the analyzing electrode 4. FIG. 1F illustrates the state wherein the just-described step is completed.

Finally, the portion of the first metal film 5 which is not covered by the analyzing electrode 4 provided by the second metal film 6 is removed by using known means of removing the first metal film 5. The known means is of the type that erodes the first metal film or electrically conductive film 5 but does not erode the electrically insulating protective coating 2 or the second metal film or the connecting electrode 6 used for external connection. The aforesaid means of removing the first metal film 5 from the electrically insulating protective coating 2 except for the area which is covered by the second metal film 6 is, for example, a known form of plasma etching technique which employs an etching gas including carbon tetrafluoride ($CF_4$) mixed with oxygen ($O_2$). Use of such a known removing means makes it easy to etch away the first metal film 5 only, but the portion of the first metal film 5 covered by the second metal film 6 does not suffer corrosion. Specifically, the first metal film 5 underlying the second metal film 6 does not suffer any serious side etching, and this prevents the occurrence of peeling of the second metal film 6.

Figure 1G:
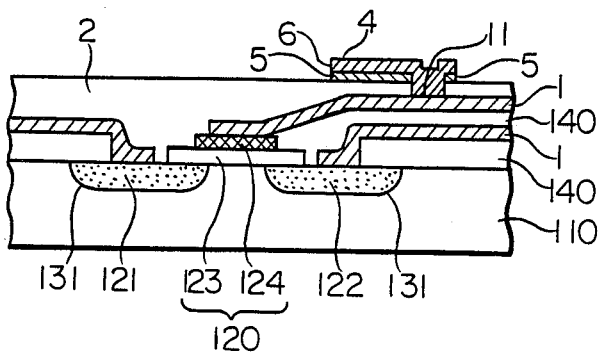

The second metal film 6 which has been obtained through the above-described process serves as the analyzing electrode 4, as shown in FIG. 1G.

Figure 5A:
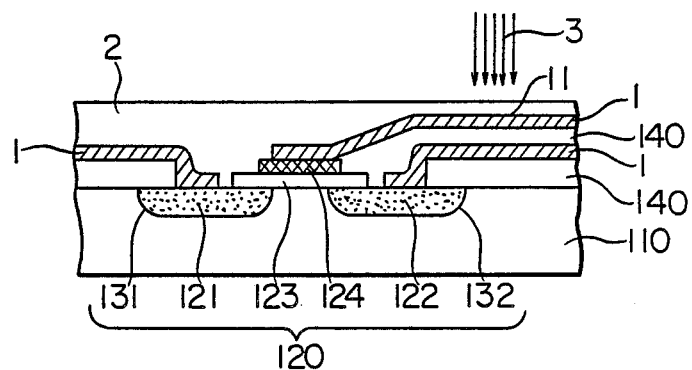
FIGS. 5A to 5E are diagrammatic, cross sections used for explaining a process sequence for an electrode forming process relying upon the prior art.
Figure 5B:
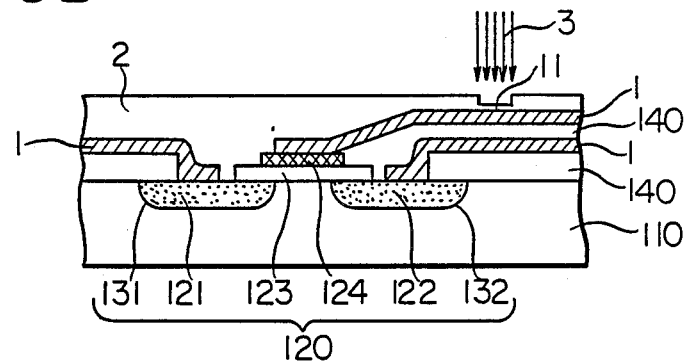
Figure 5C:
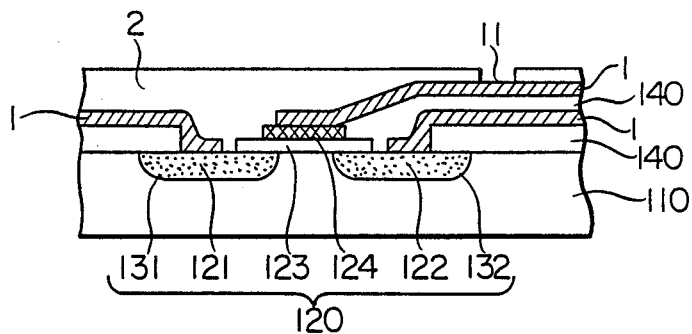
Figure 5D:
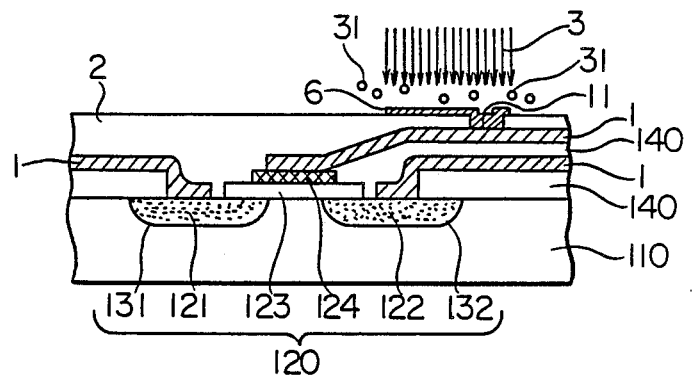
Figure 5E:
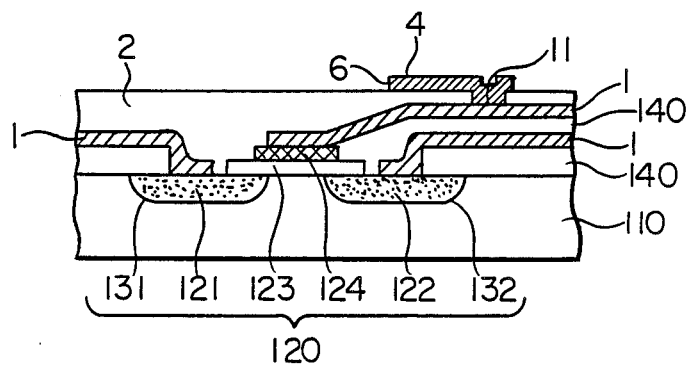
Figure 6A:
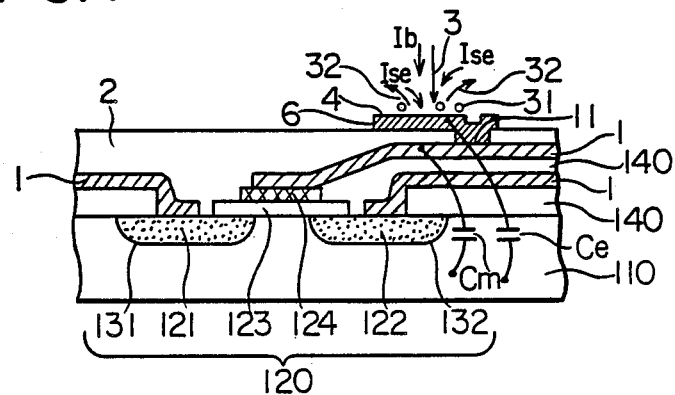
FIGS. 6A to 6C are diagrammatic, cross sections used for explaining the disadvantages of an electrode forming process which relies upon the prior art.
Figure 6B:
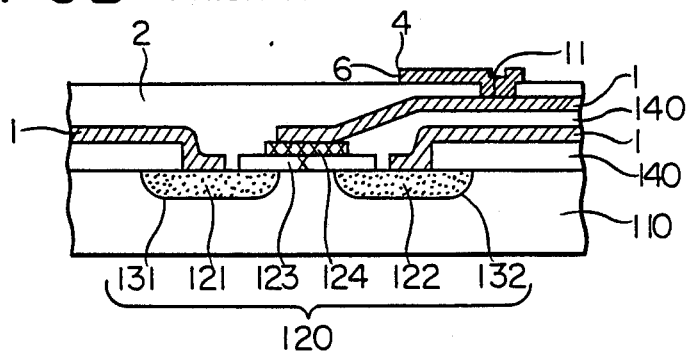
Figure 6C:
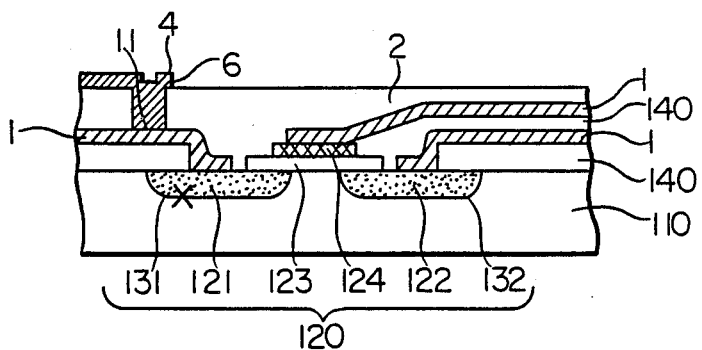

In the aforesaid process sequence for forming the analyzing electrode 4, the area occupied by the first metal film 5 is larger than that occupied by the second metal film 6. The first metal film 5 underlies the second metal film 6, and both of them are electrically connected to each other. If Ca represents the electrical capacitance which is produced between the substrate 110 and the first and second metal films 5 and 6 including the metal wire 1, it will be readily understood from the size of the area occupied by the first metal film 5 that the value of Ca is greater than that of the electrical capacitance Ce explained previously in the description of the prior art with reference to FIG. 6A. Accordingly, even if Ib, Ise, Te and the quantity of electric charge Q are the same as those used in the prior-art process explained with reference to FIG. 5D, the potential difference $Va$ ($Va = Qe/Ca = Ib . Te/Ca$; when considering the influence of the secondary electrons 32, $Va = (Ib + Ise) . Te/Ca$) which is produced when the second metal film 6 overlies the first metal film 5, the electrical capacitance Ca is smaller than the potential difference $Ve$ ($Ve = Qe/Ce = Ib . Te/Ce$; when considering the influence of the secondary electrons 32, $Ve = (Ib + Ise) . Te/Ce$) which is associated with the electrical capacitance Ce produced in the prior-art process. Accordingly, even if decomposition of the metal compound 31 is continued through irradiation of the converged ion beam 3 until the analyzing electrode 4 having a predetermined shape and size is formed on the second metal film 5, the degree of increase in the potential difference between the semiconductor substrate 110 and the first and second metal films 5 and 6 including the metal wire 1 is reduced as compared with that experienced with the prior art. Accordingly, the level of the aforesaid voltage difference Va seldom exceeds that of the withstand voltage Vt, thereby significantly reducing the frequency of the occurrence of breakdown of a semiconductor device to be analyzed. In addition, if the first metal film 5 is coated on the widest possible surface area of the electrically insulating protective coating 2, for example, if the film 5 is coated on the entire surface of a semiconductor device which assumes a chip or wafer form, it is possible to completely prevent the breakdown of the semiconductor device during the process sequence for forming the second metal film 6 or the analyzing electrode 4 on the same.

It is to be noted that, since the converged ion beam 3 having a beam diameter of 0.3 μm can be easily obtained by using gallium ions ($Ga^+$) mentioned in the aforesaid embodiment, it is possible to easily provide an electrical connection to the very thin metal wire 1 incorporated in the latest highly integrated type of semiconductor device. Also, since the converged ion beam 3 can be easily deflected and scanned, the ion beam 3 can be scanned within a predetermined area to form the analyzing electrode 4 having desired shape and size.

In the aforesaid embodiment, although the connecting portion 11 is formed on the metal wire 1, the connecting portion 11 may be formed on a single-cystal silicon (Si) substrate or a single-crystal or polycrystalline silicon (Si) film to deposit the analyzing electrode 4 thereon.

FIGS. 2A to 2I are diagrammatic, cross sections used for explaining a process sequence constituting a second preferred embodiment of the present invention.

Figure 2A:
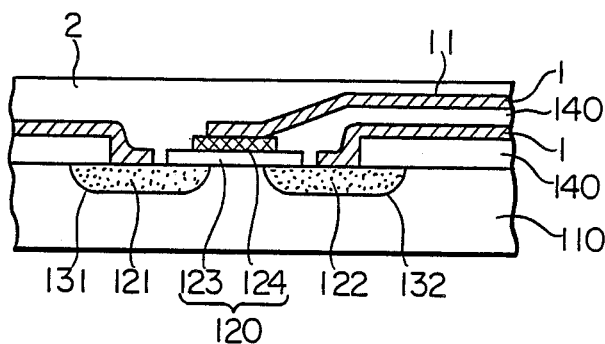
FIGS. 2A to 2I are diagrammatic, cross sections used for explaining a process sequence constituting a second preferred embodiment of the present invention.
Figure 2B:
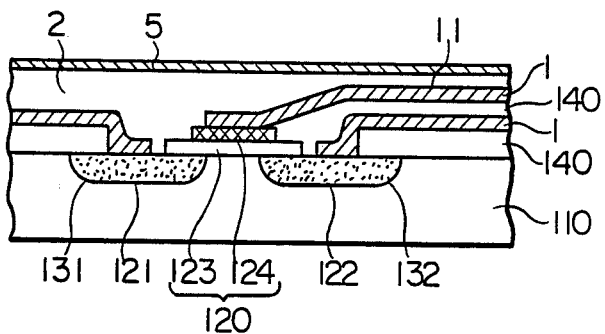

It is to be noted that, since FIGS. 2A and 2B are views similar to the previously-described FIGS. 1A and 1B and illustrate the same steps, the detailed description will be omitted.

Figure 2C:
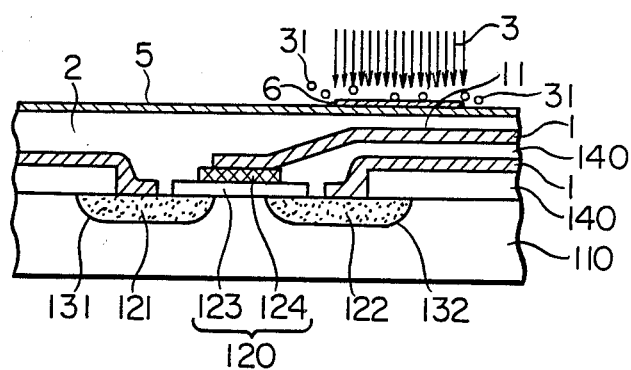
Figure 2D:
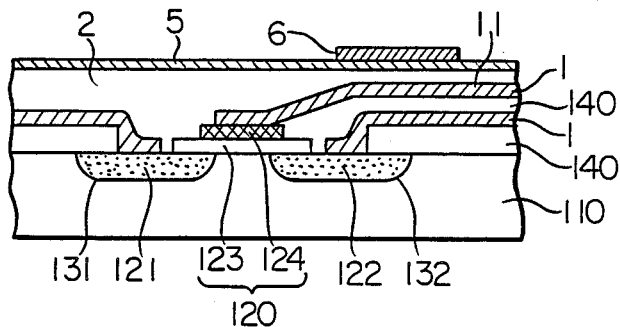

As shown in FIG. 2C, the metal compound 31 is supplied to a desired area of the first metal film 5 overlying the connecting portion 11 to be formed and at the same time the converged ion beam 3 is irradiated onto the area of the first metal film 5 which corresponds to the shape and size of the analyzing electrode 4 to be formed, thereby forming the second metal film 6. After the second metal film 6 having predetermined shape, size and thickness has been formed, the irradiation of the converged ion beam 3 and the supply of the metal compound 31 are stopped. FIG. 2D illustrates the state in which the just-described step is completed.

Figure 2E:
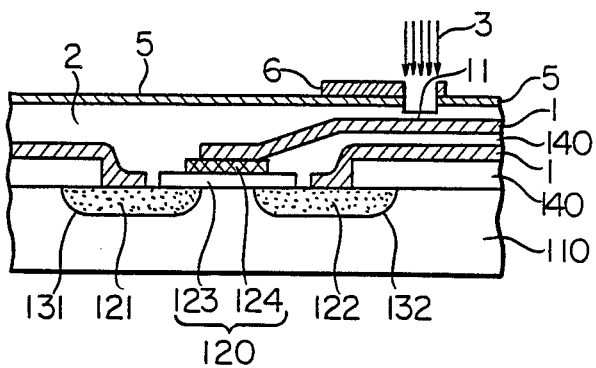
Figure 2F:
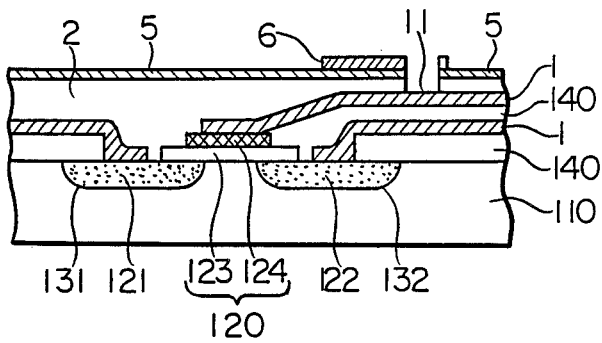

Subsequently, as shown in FIG. 2E, the second metal film 6, the first metal film 5 and the electrically insulating protective coating 2 are bored through irradiation of the converged ion beam 3. This boring is continued until the portion of the metal wire 1 corresponding to the connecting portion 11 is exposed, that is, a depth required for electrical connection is reached. Subsequently, the irradiation of the converged ion beam 3 is stopped, and the boring of the electrically insulating protective coating 2 is completed. FIG. 2F illustrates the state of the protective coating 2 which is thus bored through irradiation of the converged ion beam 3.

Figure 2G:
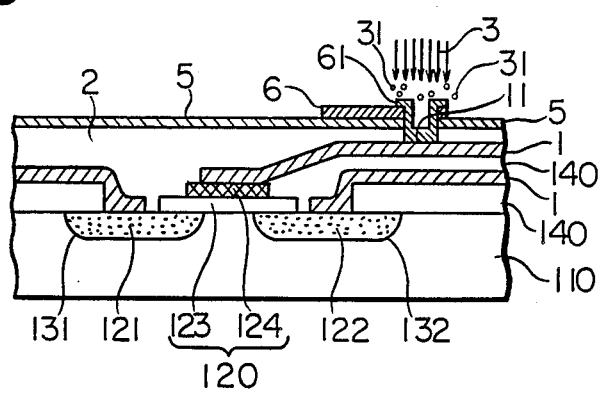
Figure 2H:
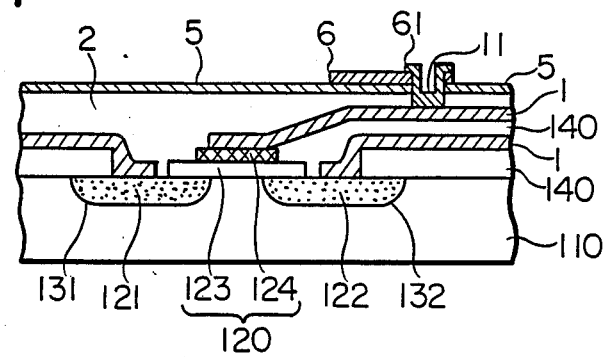

Subsequently, as shown in FIG. 2G, while the metal compound 31 is being supplied, the desired area including the bored portion is irradiated with the converged ion beam 3, thereby forming embedded metal or an electrically conductive film 61. Following the formation of the embedded metal 61 having predetermined shape, size and thickness which can provide an electrical connection between the metal wire 1 and the second metal film 6, the irradiation of the converged ion beam 3 and the supply of the metal compound 31 are stopped. FIG. 2H shows the state in which the just-described step is completed.

Finally, the portion of the first metal film 5 which is not covered by the second metal film 6 and the embedded metal 61 is removed by using known means of removing the first metal film 5 only. The known means is of the type that erodes the first metal film 5 but does not erode the electrically insulating protective coating 2, the second metal film 6 or the embedded metal 61.

Figure 2I:
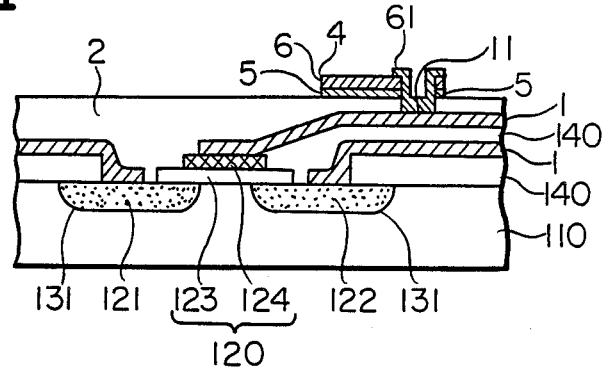

The second metal film 6 and the embedded metal 61 which have been obtained through the above-described process sequence constitute the analyzing electrode 4 as shown in FIG. 2I.

In the aforesaid second embodiment, after the metal wire 1 has been exposed at the connecting portion 11, the metal compound 31 is decomposed to generate the embedded metal 61 through irradiation of the converged ion beam 3. However, the ion irradiation period in this embodiment is shorter than the ion irradiation period required in the previously described first embodiment. Accordingly, the likelihood of breakdown of semiconductor devices is further reduced as compared with that of the first embodiment.

Figure 3A:
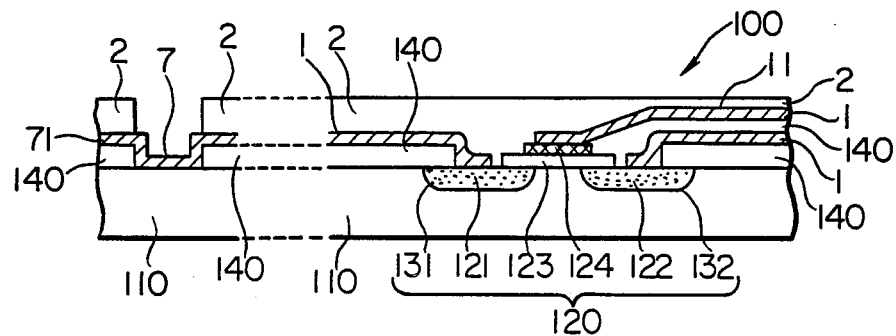
FIGS. 3A to 3J are diagrammatic, cross sections used for explaining a process sequence constituting a third preferred embodiment of the present invention.
Figure 3B:
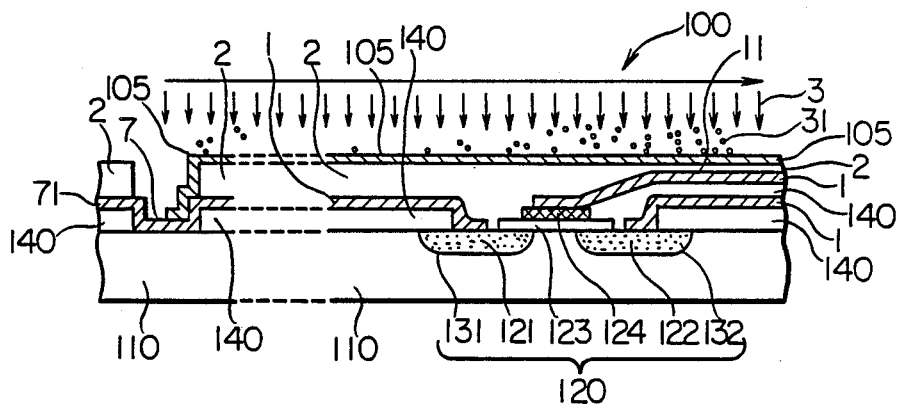
Figure 3C:
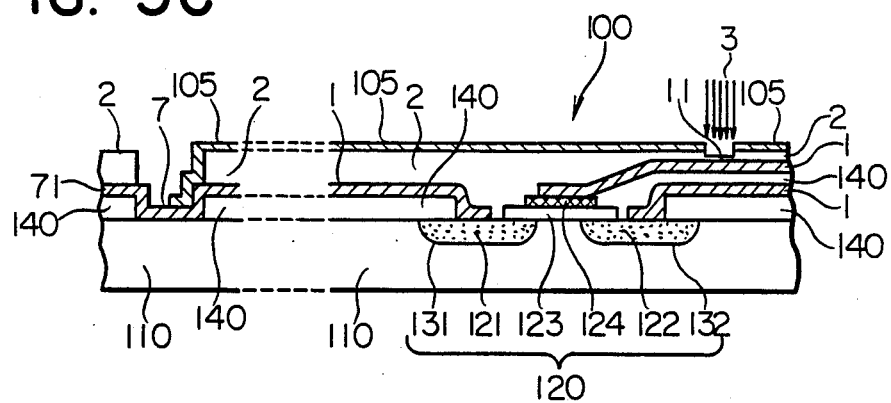
Figure 3D:
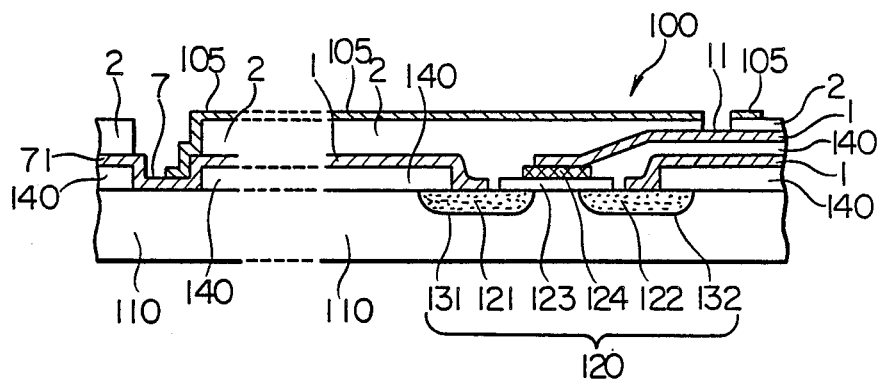
Figure 3E:
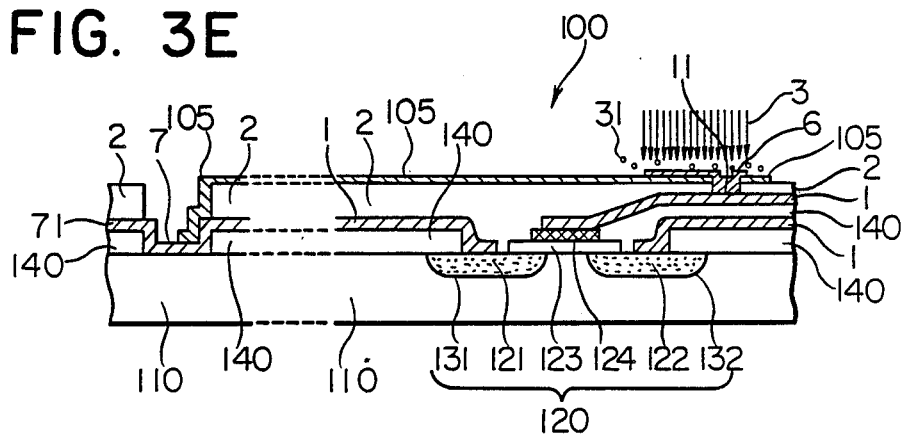
Figure 3F:
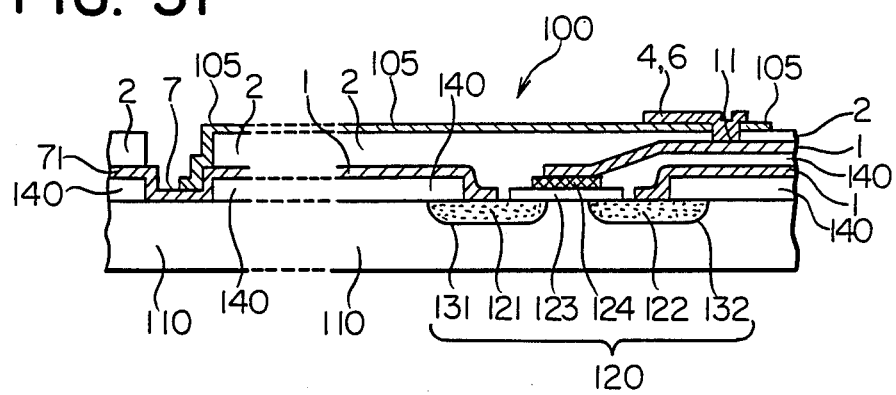
Figure 3G:
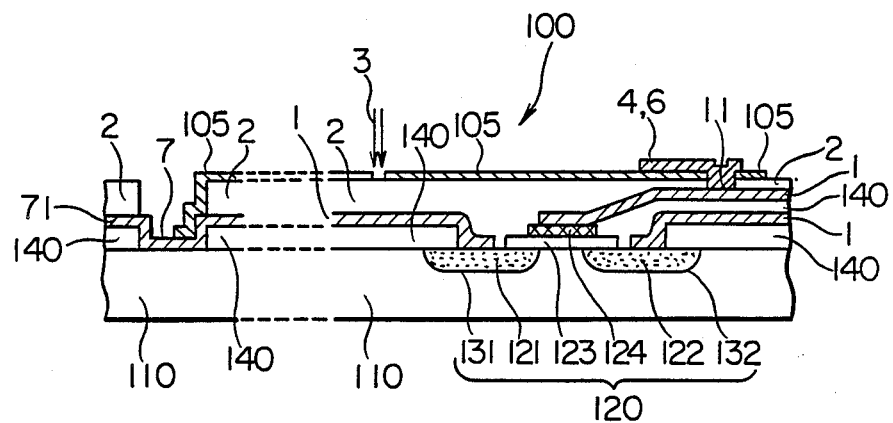
Figure 3H:
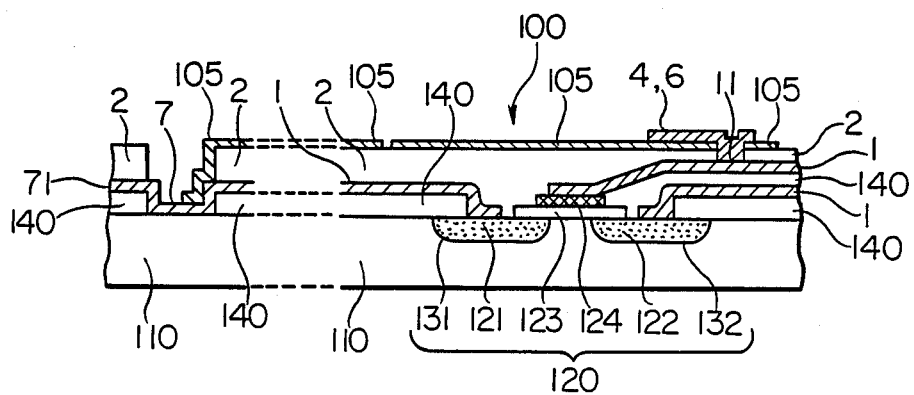
Figure 3I:
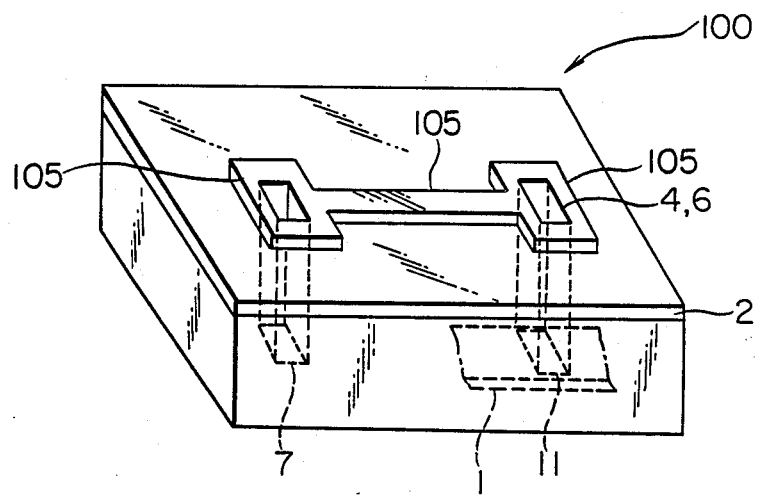

FIGS. 3A to 3I are diagrammatic, cross sections used for explaining a process sequence constituting a third preferred embodiment of the present invention, with FIG. 3I being a perspective view of FIG. 3H.

The third embodiment will be described below, with the semiconductor device shown in FIG. 3A having the same arrangement as that of the semiconductor device of FIG. 1A referred to in the first embodiment.

In the third embodiment, as shown in FIG. 3B, the converged ion beam 3 is irradiated onto the electrically insulating protective coating 2 of the semiconductor device 100, thereby forming a first metal film 105 which serves as a line-shaped or band-shaped electrically conductive layer which extends from a portion 7 to a predetermined area of the coating 2 including a portion overlying the connecting portion 11 of the metal wire 1 which is to be electrically connected to the analyzing electrode 4. The portion 7 is at the same potential as that of the substrate 110 and is hereinafter referred to as a "substrate potential portion". More specifically, while the gaseous or vaporized metal compound 31 which is decomposed to generate metal through irradiation of the converged ion beam 3 is being supplied, the converged ion beam 3 is scanned over the line-shaped or band-shaped area to form the first metal film 105 having a line-shaped or band-shaped form. However, the shape of the first metal film 105 is not confined to the line-shaped or band-shaped form; for example, it may be formed in a planar shape.

When a converged ion beam 3 is used, it is possible to form a very fine pattern on the submicron order. Since this pattern formation is performed through maskless deposition, direct lithography is possible under computerized control. In addition, there is an advantage in that this process as a whole is a low-temperature process which needs no heating step.

The metal compound 31 is made of, for example, tungsten carbonyl $(W(CO_3)_6)$ as in the case of the aforesaid first embodiment. If such a metal compound 31 is combined with the converged ion beam 3 including gallium ions $(Ga^+)$ having 30-KeV ion beam energy with an ion beam current of 100 pA to 2 nA, it is possible to form a tungsten (W) film as the first metal film 105 having, for example, a thickness of 100 nm and a width of 300 nm which realize in combination the effect of the process of the invention. The first metal film 105 having such thickness and width has electrical conductivity of the level required for performance of the effect of the invention. The metal compound 31 may be made of molybdenum carbonyl $(Mo(Co_3)_6)$, and, in this case, a molybenum (Mo) film is produced as the first metal film 105.

Also, the first metal film 105 may be coated, for example, by using known vapor deposition or sputtering of the type that involves no electrical charging or a low level of electrical charging, without causing electrical breakdown of the semiconductor device in this coating step as in the case of the above-described first preferred embodiment.

Subsequently, as shown in FIG. 3C, the converged ion beam 3 is irradiated onto the desired portion of the first metal film 105 overlying the protective coating 2 in correspondence with the connecting portion 11 to which the analyzing electrode 4 is to be connected. The constituent atoms of the thus-irradiated portions of the first metal film 105 and the protective coating 2 are scattered by sputtering. Thus, the first metal film 105 and the protective coating 2 are bored. As the converged ion beam 3, a gallium ion $(Ga^+)$ beam having 30-KeV ion beam energy with an ion beam current of 400 to 100 pA, for example, may be used. Use of such a converged ion beam 3 enables boring of the electrically insulating protective coating 2 which is composed, for example, of a silicon oxide $(SiO_2)$ film, a silicon nitride $(Si_3N_4)$ film, a film of phosphosilicate glass (PSG) or multi-layers thereof. This boring is continued until the portion of the metal wire 1 corresponding to the connecting portion 11 is exposed, that is, until a depth required for electrical connection is reached. Subsequently, the irradiation of the converged ion beam 3 is stopped, and the boring of the electrically insulating protective coating 2 is completed. FIG. 3D illustrates the bored state obtained through the irradiation of the converged ion beam 3.

Referring to FIG. 3E, while the gaseous or vaporized metal compound 31 decomposed to generate metal through irradiation of the converged ion beam 3 is being supplied to an area which includes the bored portion or the connecting portion 11 and which corresponds to the shape and size of the analyzing electrode 4 to be formed, this area is irradiated with the converged ion beam 3 to cause decomposition of the metal compound 31, thereby forming the second metal film 6. After the metal film 6 having a predetermined shape, size and thickness has been formed, the irradiation of the converged ion beam 3 and the supply of the metal compound 31 are stopped. The metal compound 31 is made of, for example, tungsten carbonyl $(W(CO_3)_6)$. If such an illustrative metal compound 31 is combined with the converged ion beam 3 including gallium ions $(Ga^+)$ having 30-KeV ion beam energy with an ion beam current of 100pA to 2 nA, a 100-nm-thick film of tungsten (W) can be formed as the second metal film 6 to serve as the analyzing electrode 4 having a sufficient thickness. If the metal compound 31 is made of molybdenum carbonyl $(Mo(Co_3)_6)$, a molybenum (Mo) film is produced as the second metal film 6. In this case, it is possible to use metal compounds of any type that produce metal by being decomposed through irradiation of the converged ion beam 3. FIG. 3F illustrates the final state wherein the just-described step is completed. The decomposition of the second metal film 6 in the just-described step, that is, the step of forming the analyzing electrode 4 proceeds in a state wherein the substrate potential portion 7 is electrically connected to the second metal coating 6. Therefore, the semiconductor device 100 is never broken.

Finally, the entire process is completed by disconnecting the electrical connection between the thus-formed analyzing electrode 4 and the substrate potential portion 7. As shown in FIG. 3G, such disconnection may be effected by disconnecting a given portion of the electrically conductive layer or the first metal film 105 which is not covered by the analyzing electrode 4. Alternatively, such disconnection may be effected through irradiation of energy rays other than the converged ion beam 3, for example, a laser beam. Furthermore, the aforesaid electrical connection may be disconnected by eroding the first metal film 105 through chemical etching or plasma etching. FIGS. 3H and 3I respectively show, in cross section and perspective, the semiconductor device 100 having the thus-formed analyzing electrode 4.

Figure 3J:
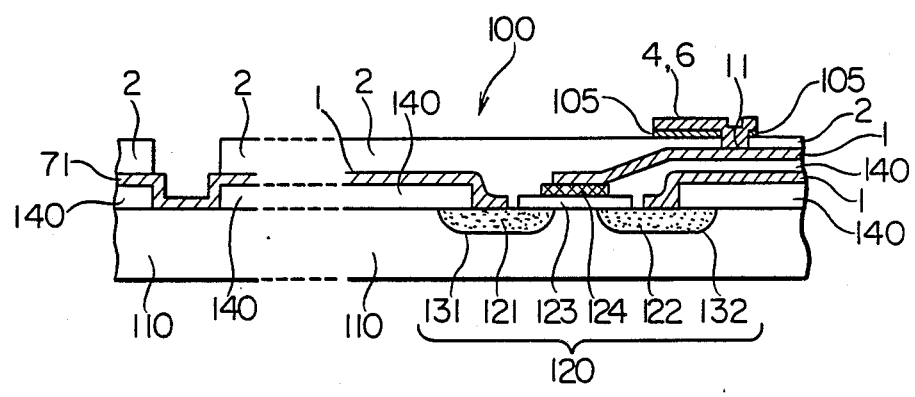

In order to disconnect the electrical connection between the analyzing electrode 4 and the substrate potential portion 7, as shown in FIG. 3J, the portion of the first metal film 105 which is not covered by the second metal film 6 may be removed by removal means of the type which erode the first metal film 105 but do not erode the electrically insulating protective coating 2 or the second metal film 6. Such removal means may preferably be selected from the group consisting of chemical etching or plasma etching employing etching gas under the conditions that the first metal film 105 is rapidly etched while the electrically insulating protective coating 2 and the second metal film 6 are slowly etched. In this case, if the first metal film 105 and the second metal film 6 are made of a similar metal material, since the area in which the analyzing electrode 4 is to be formed is constituted by both the first metal film 105 and the second metal film 6, if the etching conditions such as etching time are suitably selected, it is possible to remove only the portion of the first metal film 105 which is not covered by the second metal film 6 with the second metal film 6 left in place. In this case, even if the thickness of the area serving as the analyzing electrode 4 is somewhat reduced, failure analysis is not precluded in practical terms. In the case of the illustratively-described arrangement including: the electrically insulating protective coating 2; the first metal film 105 and the second metal film 6, an etching gas may be, for example, a mixed gas containing carbon tetrafluoride ($CF_4$) and oxygen ($O_2$)

In this manner, the portion of the first metal film 105 which is not covered by the second metal film 6 is completely removed, none of the first metal film 105 will remain except for those regions in which the analyzing electrode 4 is to be formed. Therefore, when a plurality of analyzing electrodes 4 are to be formed on the semiconductor device 100, the just-described process is recommended.

In the above-described third embodiment, the substrate potential portion 7 is provided on the portion of the metal wire 1 which is formed directly on the substrate 110 and which is at the same potential as that of the substrate 110. However, a portion of the substrate 110 may be utilized as the substrate potential portion 7.

Also, as described previously with reference to FIGS. 3C and 3D, the constituent atoms of the electrically insulating protective coating 2 are scattered through irradiation of the converged ion beam 3. Thus, the electrically insulating protective coating 2 is bored until the surface of the substrate 110 is exposed, and the thus-bored portion may be utilized as the substrate potential portion 7.

FIGS. 4A to 4K are diagrammatic, cross sections used for explaining a process sequence of a fourth preferred embodiment for forming an electrode for a semiconductor device in accordance with the present invention.

Figure 4A:
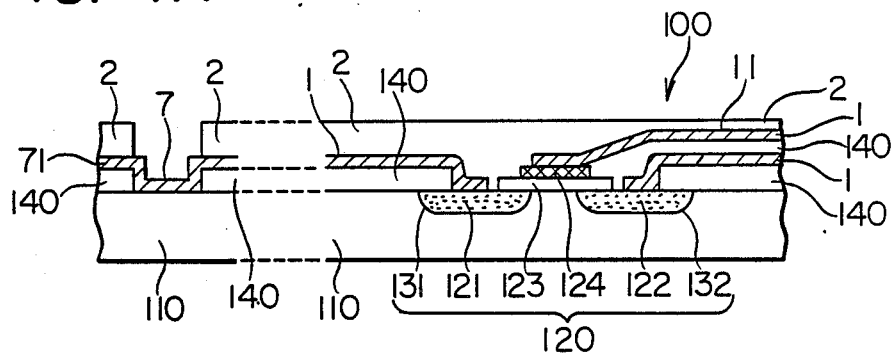
FIGS. 4A to 4K are diagrammatic, cross sections used for explaining a process sequence constituting a fourth preferred embodiment of the present invention.
Figure 4B:
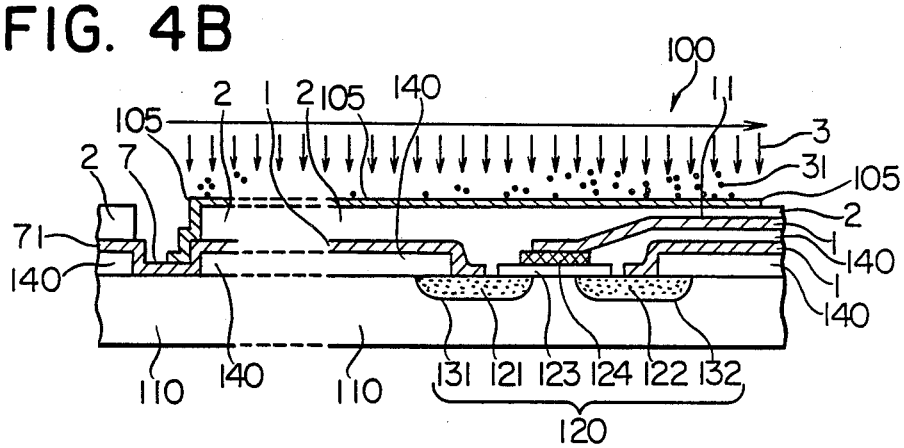

FIGS. 4A and 4B are views similar to FIGS. 3A and 3B, respectively, and the descriptions thereof will be omitted.

Figure 4C:
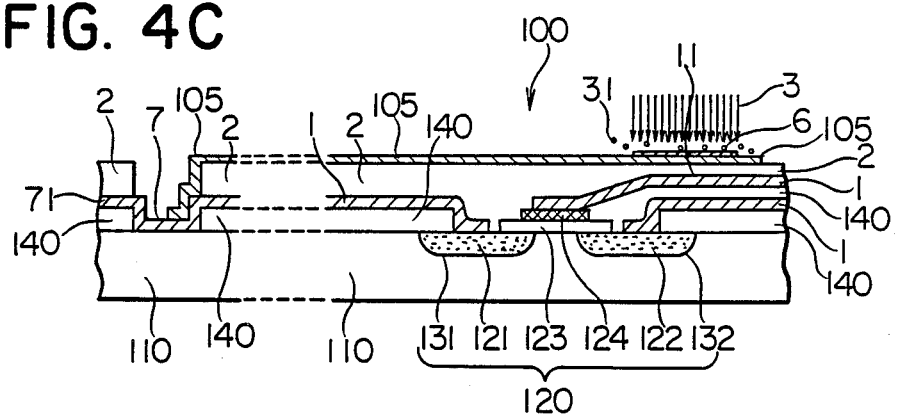
Figure 4D:
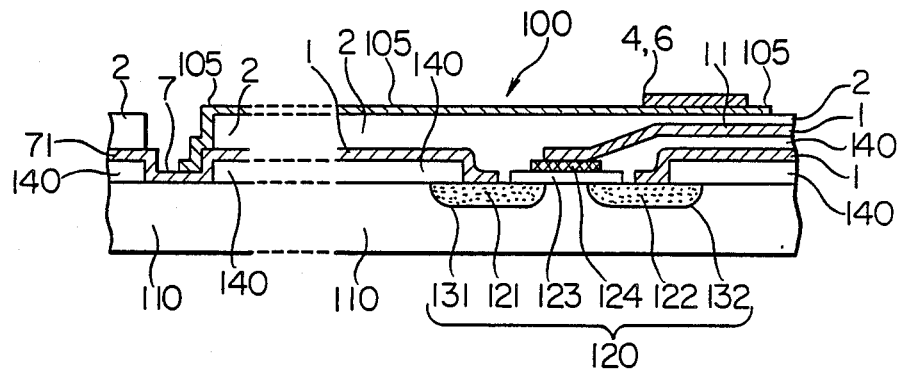

Referring to FIG. 4C, the metal compound 31 is supplied to the desired area of the first metal film 105 which includes a portion corresponding to the connecting portion 11 to which the electrode 4 is to be connected and at the same time the converged ion beam 3 is irradiated onto the area of the first metal film 105 which corresponds to the shape and size of the analyzing electrode 4 to be formed. In this manner, the metal compound 31 is decomposed to generate metal through irradiation of the converged ion beam 3, thereby forming the second metal film 6. After the second metal film 6 having a predetermined shape, size and thickness has been formed, the irradiation of the converged ion beam 3 and the supply of the metal compound 31 are stopped. FIG. 4D illustrates the final state in which the just-described step is completed.

Figure 4E:
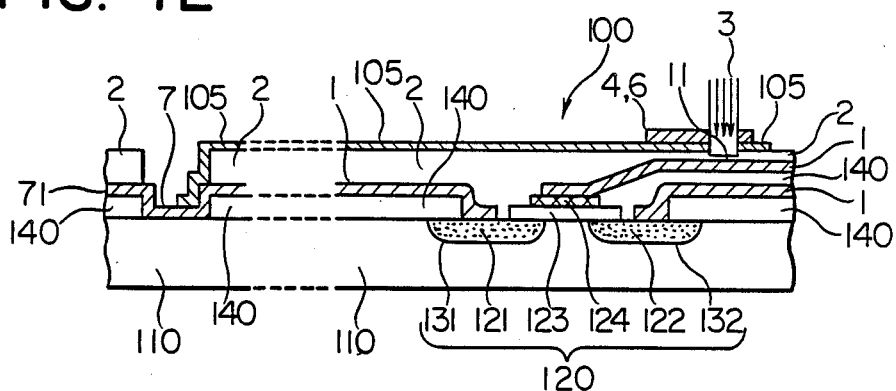
Figure 4F:
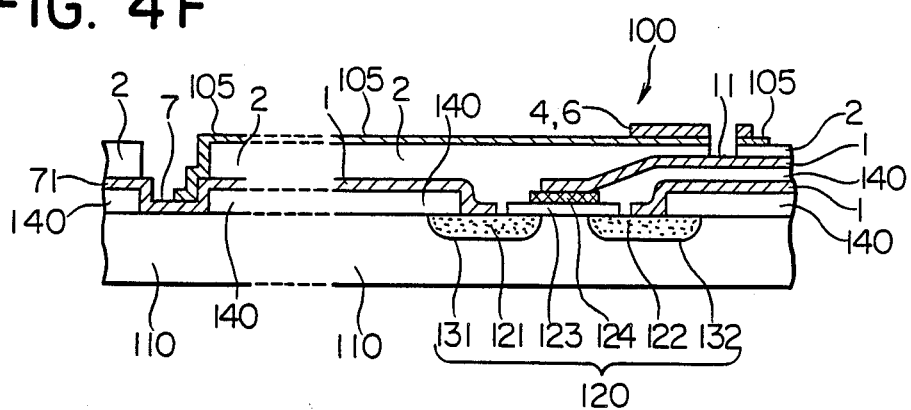

Subsequently, as shown in FIG. 4E, the second metal film 6, the first metal film 105 and the electrically insulating protective coating 2 are bored through irradiation of the converged ion beam 3. This boring is continued until the portion of the metal wire 1 corresponding to the connecting portion 11 is exposed, that is, until a depth required for electrical connection is reached. Subsequently, the irradiation of the converged ion beam 3 is stopped, and the boring of the electrically insulating protective coating 2 is completed. FIG. 4F illustrates the state of the protective coating 2 which is thus bored through irradiation of the converged ion beam 3.

Figure 4G:
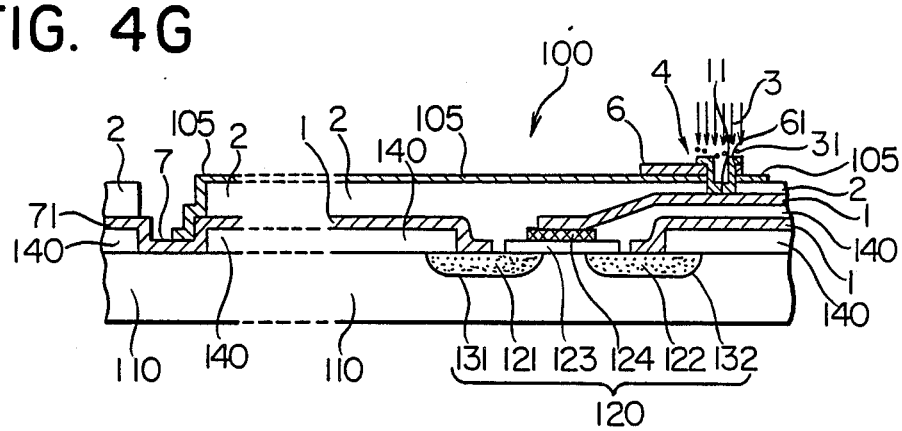
Figure 4H:
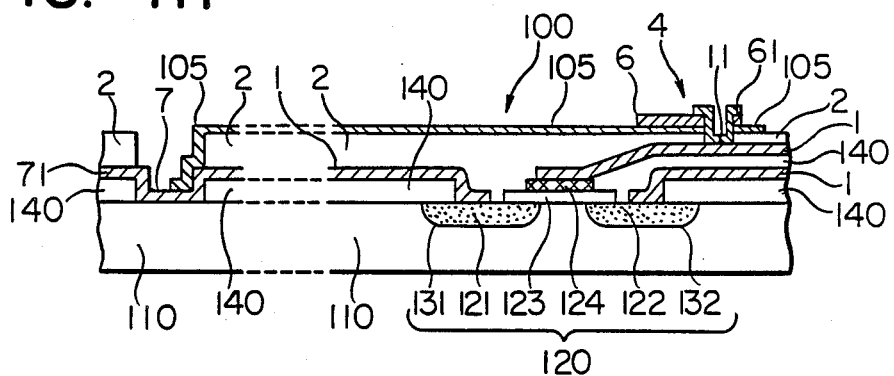

Subsequently, as shown in FIG. 4G, while the metal compound 31 is being supplied, the desired area including the bored portion and a portion of the remaining non-bored portion adjacent to the bored portion is irradiated with the converged ion beam 3, thereby forming embedded metal or an electrically conductive film 61 through breakdown of the metal compound 31 caused by irradiation of the converged ion beam 3. Following the formation of the embedded metal 61 having predetermined shape, size and thickness which can provide an electrical connection between the metal wire 1 and the second metal film 6, the irradiation of the converged ion beam 3 and the supply of the metal compound 31 are stopped. FIG. 4H shows the last state in which the just-described step is completed.

Figure 4I:
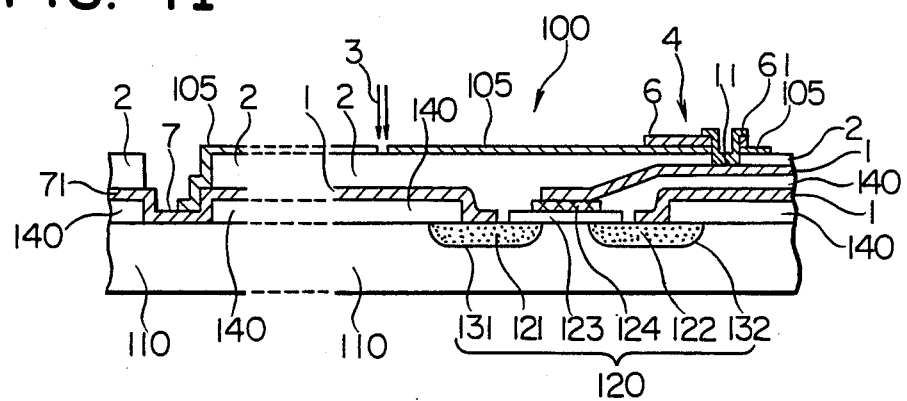
Figure 4J:
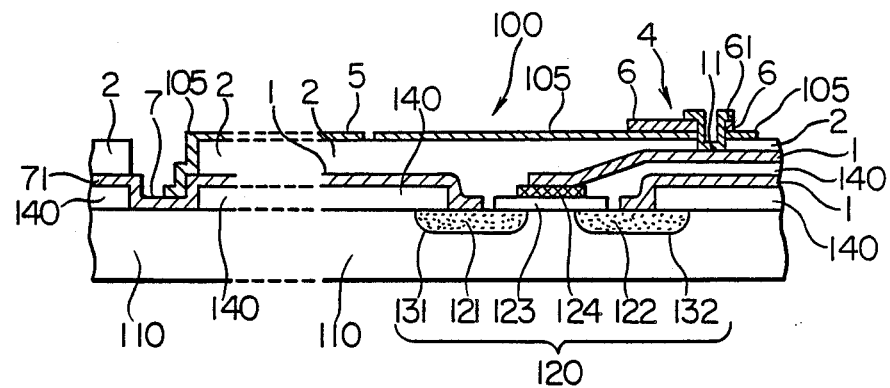

Finally, as shown in FIG. 4I or 4J, the electrical connection between the thus-formed analyzing electrode 4 and the substrate potential portion 7 is disconnected, and this completes the entire process sequence. As shown in FIG. 3G or 3I, this disconnection is performed in substantially the same manner as that of the previously-described third embodiment. Thus, the detailed description thereof is omitted.

Figure 4K:
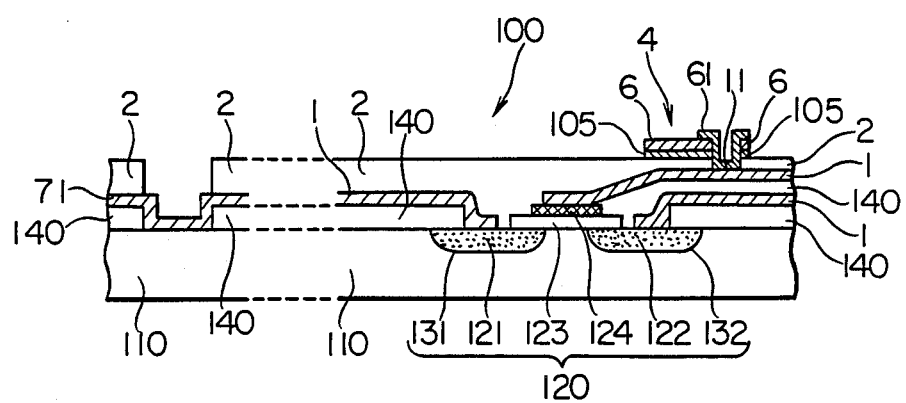

The second metal film 6 and the embedded metal 61 which are obtained through the aforesaid process sequence constitute in combination the analyzing electrode 4 shown in FIG. 4K.

In the aforesaid fourth embodiment, after the metal wire 1 has been exposed at the connecting portion 11, the metal compound 31 is decomposed to form embedded metal 61 through irradiation of the converged ion beam 3. However, the ion irradiation period in this embodiment is shorter than the ion irradiation period required in the previous-described third embodiment. Accordingly, the likelihood of breakdown of the semiconductor device 100 is further reduced as compared with that of the third embodiment.

It is to be noted that the kind of embedded metal 61 may be the same as or different from that of the second metal film 6.

Also, in either of the respective preferred embodiments described above, in order to form the analyzing electrode 4 on the connecting portion 11, while the metal compound 31 is being supplied to the area including the exposed portion of the metal wire 1, this area is irradiated with the converged ion beam 3. However, if the metal wire 1 is sufficiently thick, the constituent atoms of the metal wire 1 may be scattered by sputtering to form the analyzing electrode 4 without supplying the metal compound 31.

In addition, in either of the respective preferred embodiments, reference is made to the formation of a failure analyzing electrode. However, it will be appreciated that the present invention is applicable to the formation of electrodes which are used for other purposes.

Since many changes can be made in the above construction and many apparently widely different embodiments of this invention can be made without departing from the scope thereof, it is intended that all matter contained in the drawing and specification should be interpreted illustratively and not in a limited sense.

What is claimed is:

1. A process for forming electrodes for semiconductor devices having a semiconductor substrate and an electrically conductive portion covered and protected by an electrically insulating coating, said process comprising:
    a first step of forming an electrically conductive film on said electrically insulating coating;
    a second step of removing the portions of said electrically insulating coating and said electrically conductive film which overlie a desired position on said electrically conductive portion by irradiating those portions with a converged ion beam to expose the part of said electrically conductive portion which corresponds to said desired position;
    a third step of forming on a portion of said electrically conductive film an electrode to be connected to an external circuit by subjecting the exposed part of the electrically conductive portion to a converged ion beam in the presence of a gaseous or vaporized metal compound such as tungsten carbonyl and molybdenum carbonyl that is decomposed where irradiated by the converged ion beam to produce a metal film, said electrode including the exposed part of said electrically conductive portion; and
    a fourth step of removing the portions of said electrically conductive film that are not covered by said electrode.

2. The process according to claim 1, wherein said electrically conductive film in a planar form.

3. The process according to claim 1, wherein said fourth step utilizes erosion in removing the portion of said electrically conductive film which is not covered by said electrode.

4. The process according to claim 3, wherein said erosion is effected by etching means of the type that erodes said electrically conductive film but does not erode said electrode.

5. The process according to claim 4, wherein said etching means is chemical etching.

6. The process according to claim 4, wherein said etching means is plasma etching employing etching gas.

7. The process according to claim 6, wherein said etching gas is a mixed gas including carbon tetrafluoride and oxygen.

8. The process according to claim 1, wherein said metal compound is tungsten carbonyl.

9. The process according to claim 1, wherein said metal compound is molybdenum carbonyl.

10. The process according to claim 1, wherein said electrically insulating coating is selected from the group consisting of a silicon oxide film, a film of phosphosilicate glass and a silicon nitride film.

11. The process according to claim 1, wherein said electrically conductive film is formed by one of vapor deposition and sputtering.

12. The process according to claim 11, wherein said electrically conductive film is made of gold.

13. The process according to claim 1, wherein said electrically conductive portion is a layer serving as wiring.

14. A process for forming electrodes for semiconductor devices having a semiconductor substrate and an electrically conductive portion covered and protected by an electrically insulating coating, said process comprising the steps of:
    forming a first electrically conductive film on the electrically insulating coating;
    forming an electrode to be connected to an external circuit on said first electrically conductive film at a position overlying the electrically conductive portion on a portion of said first electrically conductive film by exposing portions of the electrically insulating coating and the first electrically conductive film to a converged ion beam in the presence of a gaseous or vaporized metal compound such as tungsten carbonyl and molybdenum carbonyl that is decomposed where irradiated by the converged ion beam to produce a metal film;
    electrically connecting said electrode to a portion of the first electrically conducting film; and
    removing the portions of the first electrically conductive film that are not covered by said electrode.

15. The process of claim 14 wherein said forming and electrically connecting steps comprise boring a hole thought said electrically insulating coating with said converged ion beam and depositing a second electrically conductive film at least partially in said hole on said electrically conductive film by supplying to said electrically conductive portion the gaseous or vaporized metal compound that is decomposed by said ion beam.

16. The process of claim 15 wherein said first electrically conductive film extends to a position on said electrically insulating coating having the same potential as that of the semiconductor substrate and including, after electrically connecting said electrode, electrically disconnecting said electrode from said position having the same potential as said substrate by removing a portion of the first electrically conductive layer.

17. The process of claim 14 wherein said forming and electrically connecting steps comprise depositing a second electrically conductive film on said first electrically conductive film by supplying a gaseous or vaporized metal compound that is decomposed by said ion beam, boring a hole through said first and second electrically conducting films and said electrically insulating coating with said ion beam and electrically connecting said electrically conductive portion by depositing a third electrically conductive film at least partially in said hole on said electrically conductive portion and on said second electrically conductive film by supplying to said electrically conductive portion a gaseous or vaporized metal compound that is decomposed by said converged ion beam.

18. The process of claim 17 wherein said first electrically conductive film extends to a position on said electrically insulating coating having the same potential as that of the semiconductor substrate and including, after electrically connected said electrode, electrically disconnecting said electrode from said position having the same potential as said substrate by removing a portion of the first electrically conductive layer.

* * * * *